(12) United States Patent
Igari et al.

(10) Patent No.: US 8,258,537 B2
(45) Date of Patent: Sep. 4, 2012

(54) EFFICIENT LIGHT EMITTING SEMICONDUCTOR DEVICE

(75) Inventors: Tomoki Igari, Tokyo (JP); Tomohiko Sagimori, Tokyo (JP); Mitsuhiko Ogihara, Tokyo (JP); Takahito Suzuki, Tokyo (JP); Hiroyuki Fujiwara, Tokyo (JP); Hironori Furuta, Tokyo (JP); Yusuke Nakai, Tokyo (JP)

(73) Assignee: Oki Data Corporation, Tokyo (JP)

( * ) Notice: Subject to any disclaimer, the term of this patent is extended or adjusted under 35 U.S.C. 154(b) by 254 days.

(21) Appl. No.: 12/397,466

(22) Filed: Mar. 4, 2009

(65) Prior Publication Data

US 2009/0224276 A1 Sep. 10, 2009

(30) Foreign Application Priority Data

Mar. 5, 2008 (JP) ................................. 2008-055474

(51) Int. Cl.
*H01L 33/00* (2010.01)

(52) U.S. Cl. ................ 257/99; 257/82; 257/84; 257/91; 257/98; 257/100; 438/26; 438/29; 438/42

(58) Field of Classification Search ........... 257/E33.056, 257/E33.059, 81, 82, 91, 98, 99, 100, 116, 257/117, 432, 433, 434, 435, 436, 437, 749, 257/79, 80, 90, 83, 84, 95, 431; 438/FOR. 417, 438/25, 26, 27, 28, 29, 30, 31, 32, 33, 34, 438/35, 127, 42

See application file for complete search history.

(56) References Cited

U.S. PATENT DOCUMENTS

| | | | | |
|---|---|---|---|---|
| 6,791,151 | B2* | 9/2004 | Lin et al. | 257/434 |
| 7,070,304 | B2* | 7/2006 | Imai | 362/267 |
| 7,372,619 | B2* | 5/2008 | Miles | 359/291 |
| 2002/0085785 | A1* | 7/2002 | Kishimoto et al. | 385/14 |
| 2005/0082673 | A1* | 4/2005 | Fujiwara et al. | 257/758 |
| 2005/0242355 | A1* | 11/2005 | Guenther et al. | 257/82 |
| 2008/0023722 | A1* | 1/2008 | Lee et al. | 257/99 |
| 2008/0185956 | A1* | 8/2008 | Hiramatsu | 313/498 |
| 2010/0046234 | A1* | 2/2010 | Abu-Ageel | 362/308 |

FOREIGN PATENT DOCUMENTS

| | | | |
|---|---|---|---|
| JP | 07-335967 | A | 12/1995 |
| JP | 2002-009379 | A | 1/2002 |
| JP | 2003-168825 | A | 6/2003 |
| JP | 2004-356213 | A | 12/2004 |
| JP | 2005-051138 | A | 2/2005 |
| JP | 2005-150703 | A | 6/2005 |

* cited by examiner

*Primary Examiner* — Ha Tran T Nguyen
*Assistant Examiner* — Thanh Y Tran
(74) *Attorney, Agent, or Firm* — Marvin A. Motsenbocker; Mots Law, PLLC

(57) ABSTRACT

Provided is a technique of effectively extracting the beams of light excited in an LED light emitter other than the light beams emitted from a light-emitting region in the direction of a light-extraction surface. A pit with a tapered sidewall is formed in a substrate. A thin-film semiconductor element is attached to the pit. Light beams emitted from a side surface of the thin-film semiconductor element are reflected by the sidewall of the thin-film semiconductor element. Achieved thereby is effective extraction of light beams other than the light beams emitted from the light-emitting region in the direction of the light-extraction surface.

10 Claims, 11 Drawing Sheets

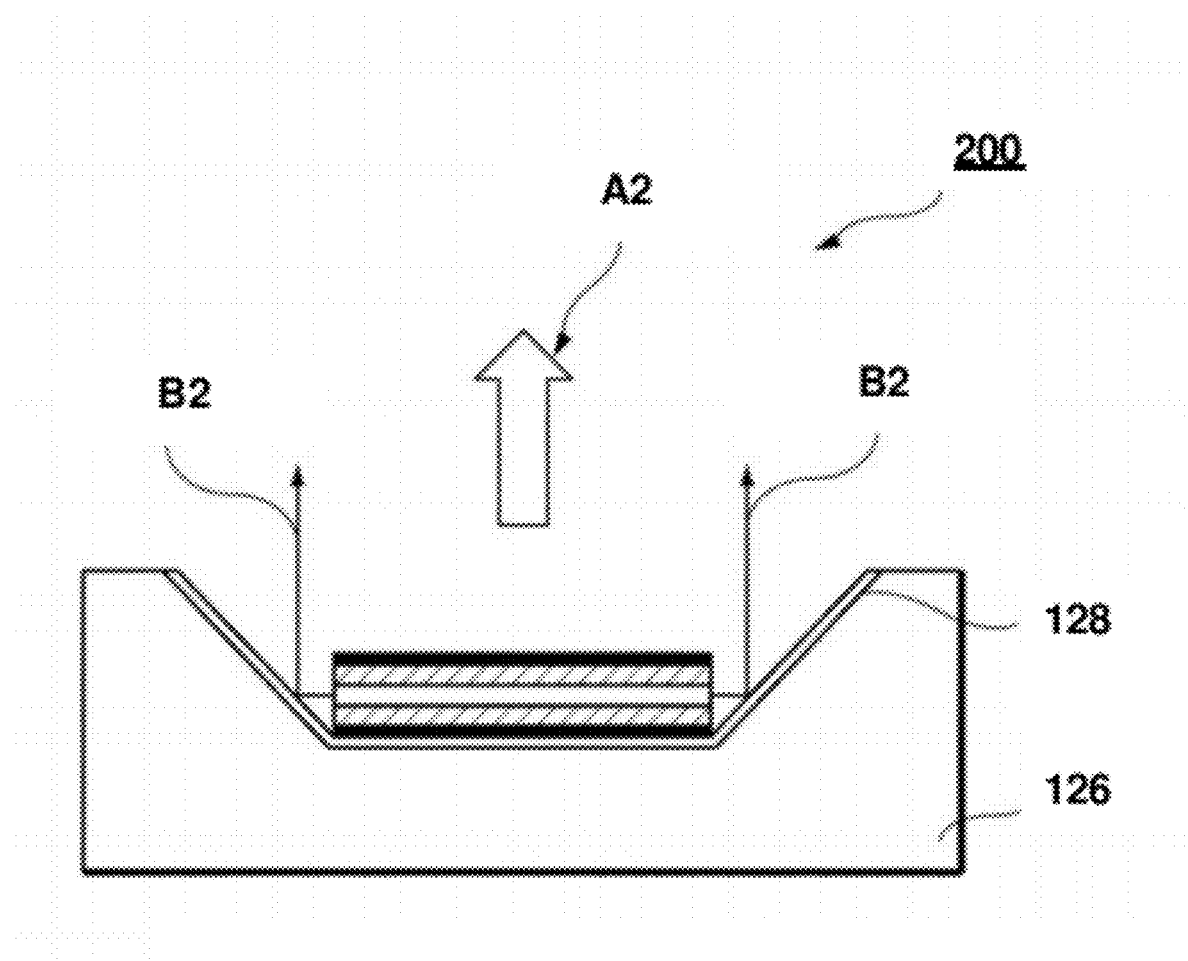

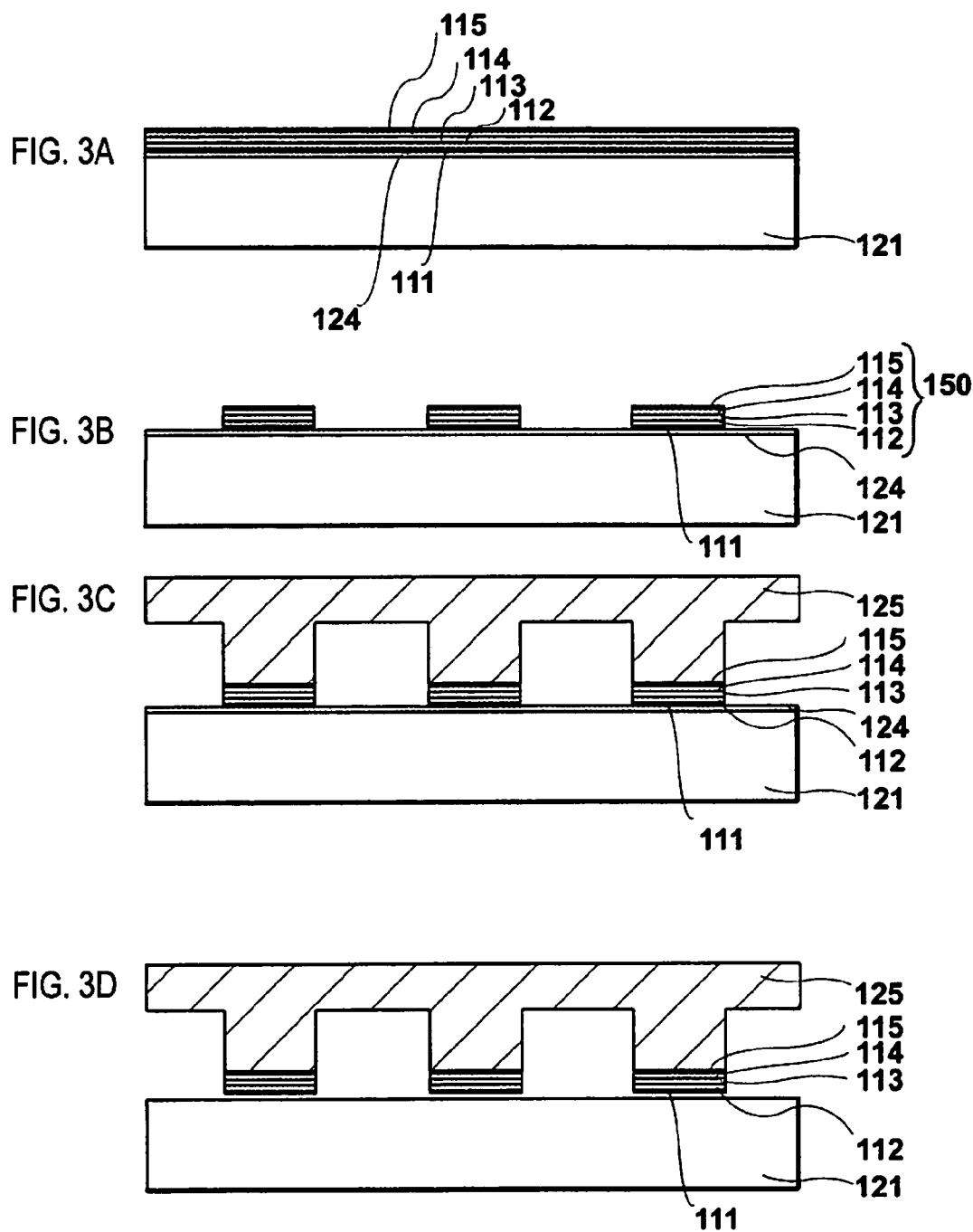

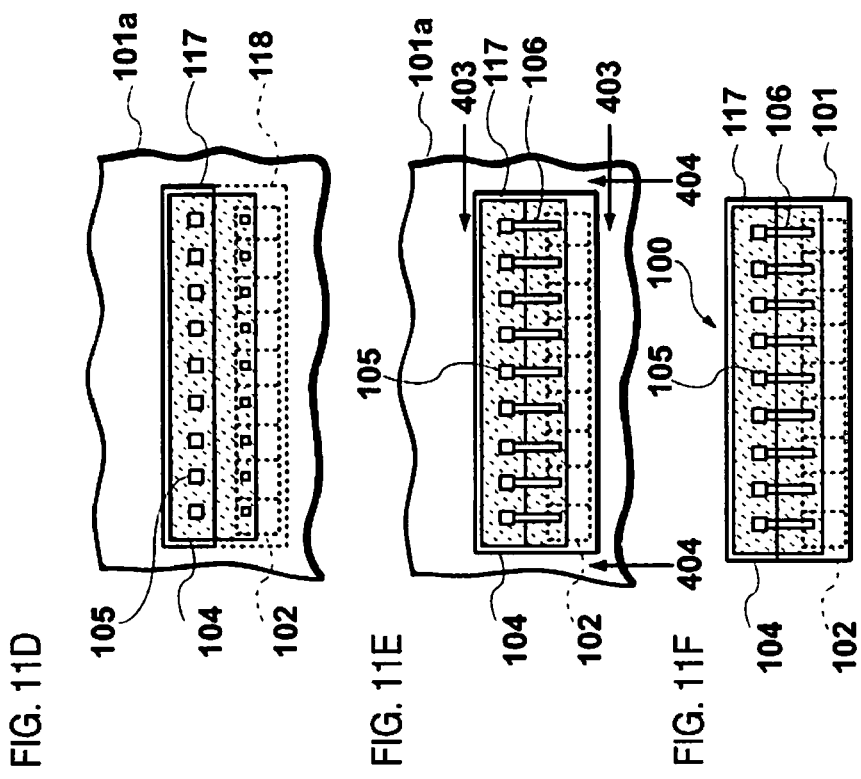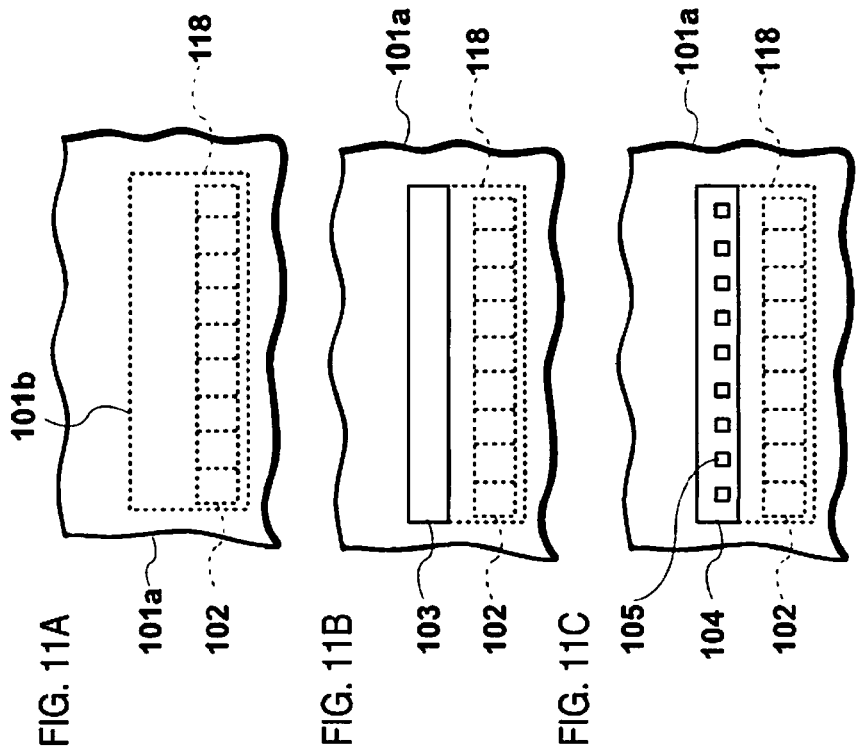

EFFICIENT LIGHT EMITTING SEMICONDUCTOR DEVICE

CROSS REFERENCE TO RELATED APPLICATIONS

This application claims priority based on 35 USC 119 from prior Japanese Patent Application No. P2008-055474 filed on Mar. 5, 2008, entitled "Semiconductor Device, LED Head and Image Forming Apparatus", the entire contents of which are incorporated herein by reference.

BACKGROUND OF THE INVENTION

1. Field of the Invention

The invention relates to a semiconductor device, an LED head, and an image forming apparatus.

2. Description of Related Art

There is a known technique of efficient light extraction in the field of optical semiconductor devices used in such elements as light-emitting elements and light-receiving elements. According to the technique, a layer with high optical reflectance is formed as one of the layers included in the semiconductor device. In the semiconductor device, the light that goes in the direction of the light-extraction surface can be extracted from the light-extraction surface. Besides, the light that goes out in the direction of the backside surface of the semiconductor thin film is reflected by the high-reflective layer and thus can be extracted from the light-extraction surface as well.

The conventional technique makes it possible to extract, out of the light excited in the light emitter, the light going out from the light-emitting region towards the light-extraction surface as well as the light going out from the light-emitting region towards the side opposite to the light-extraction surface and being reflected by the light-reflection layer so as to go out of the light emitter from the light-extraction surface. However, most of the light that goes out from the light-emitting region in directions other than the above-mentioned ones cannot be extracted.

SUMMARY OF THE INVENTION

An aspect of invention provides a semiconductor device that comprises: a substrate with a pit formed in a surface thereof; and a thin-film semiconductor element attached to the pit formed in the substrate.

The device can deflects, by means of a sidewall of the pit, light beams emitted from a side surface of the light-emitting element into the direction of light beams emitted from a light-extraction surface of the light-emitting element. Accordingly, the light-extraction efficiency can be improved.

Another aspect of invention provides a semiconductor device that comprises: a substrate with a pit formed in a surface thereof, wherein a filler capable of transmitting light is filled in the pit; and a thin-film semiconductor element attached to the top of the filler filled in the pit formed in the substrate.

The device can reflect, by means of an internal surface of the pit, light beams that spread towards a floor of the light-emitting element so as to converge into the direction of light beams emitted from a light-extraction surface of the light-emitting element. Accordingly, the light-extraction efficiency can be improved.

Still another aspect of the invention provides a light emitting diode (LED) head, comprising the semiconductor mentioned in the summary of the invention.

Furthermore, an aspect of the invention provides an image forming apparatus, comprising the LED head above mentioned in the summary of the invention.

BRIEF DESCRIPTION OF THE DRAWING

FIG. 2 is a side view illustrating a cross section of an LED light emitter according to a modified example of Embodiment 1.

FIGS. 3A to 3D are a first series of diagrams for describing a method of manufacturing the LED light emitter according to Embodiment 1.

FIGS. 11A to 11F are diagrams for describing processes of manufacturing the composite chip of LED and driving IC.

DETAILED DESCRIPTION OF EMBODIMENTS

Figure 1:
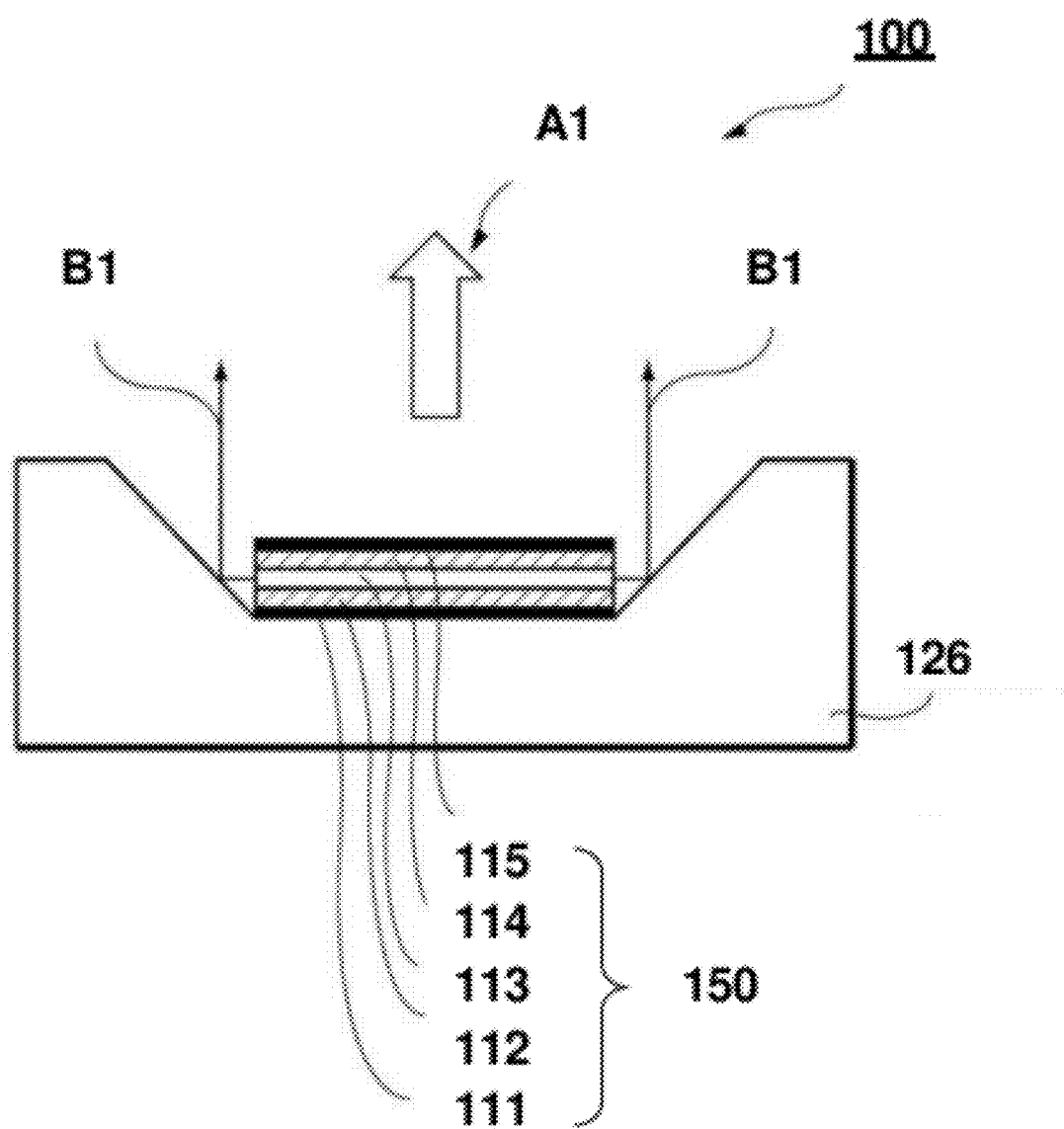
FIG. 1 is a side view illustrating a cross section of an LED light emitter according to Embodiment 1.

Descriptions are provided hereinbelow for embodiments based on the drawings. In the respective drawings referenced herein, the same constituents are designated by the same reference numerals and duplicate explanation concerning the same constituents is basically omitted. All of the drawings are provided to illustrate the respective examples only. No dimensional proportions in the drawings shall impose a restriction on the embodiments. For this reason, specific dimensions and the like should be interpreted with the following descriptions taken into consideration. In addition, the drawings include parts whose dimensional relationship and ratios are different from one drawing to another.

Prepositions, such as "on", "over" and "above" may be defined with respect to a surface, for example a layer surface, regardless of that surface's orientation in space. The preposition "above" may be used in the specification and claims even if a layer is in contact with another layer. The preposition "on" may be used in the specification and claims when a layer is not in contact with another layer, for example, when there is an intervening layer between them.

Figure 10:
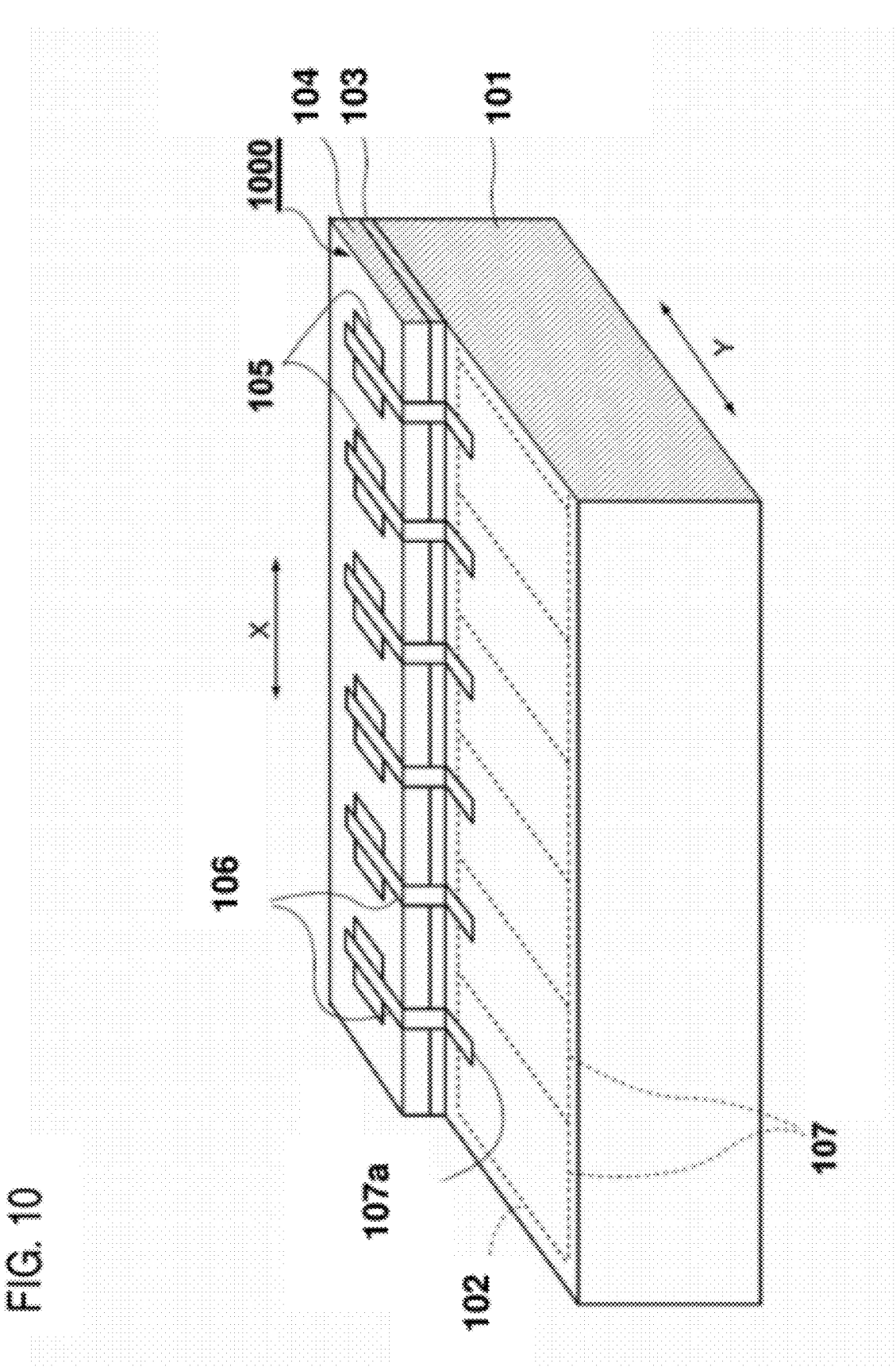
FIG. 10 is a perspective view of a composite chip of LED and driving IC.

Now, descriptions are given of a semiconductor device and a method of manufacturing the semiconductor device. FIG. 10 is a perspective view of a composite chip of LED and driving IC. FIG. 10 shows that composite chip 1000 of LED and driving IC includes: Si substrate 101 including integrated circuit 102; and a conductive layer, such as metal layer 103, formed on Si substrate 101.

In addition, composite chip 1000 of LED and driving IC includes: an epitaxial film that is a sheet-like semiconductor thin film attached onto metal layer 103 (hereafter, the epitaxial film is referred to as LED epi-film 104); and plural individual wiring layers 106. Metal layer 103 is connected, for example, to the ground. Plural LED 105 (light emitters) are formed integrally with LED epi-film 104 of the embodiments. Plural LED 105 are arranged, at a constant pitch, in a straight line (in the X direction, which is the same direction that driving ICs to drive LEDs are arranged in).

FIGS. 11A to 11F are diagrams for describing processes of manufacturing the composite chip of LED and driving IC. As FIG. 11A shows, the manufacturing of composite chip 1000 of LED and driving IC starts with the formation of integrated circuit 102 in a chip-formation region 118 of semiconductor wafer 101a (Si substrate 101).

Following this is the formation of metal layer 103 in chip-formation region 118, as FIG. 11B shows. Then, as FIG. 11C shows, LED epi-film 104 is attached to the top surface of metal layer 103. After that, as FIG. 11D shows, insulating film 117 is formed to cover at least the individual-wiring formation region located between elements (LEDs) within LED epi-film 104 and connection region of individual wiring layers 106 within an IC region (the region in which integrated circuit 102 is formed).

Subsequently, as FIG. 11E shows, thin-film individual wiring layers 106 are formed on top of insulating film 117 by the lift-off method or by the photo-lithography technique. Then, the wafer is diced along dicing lines 403 and 404, and thus produced is composite chip 1000 of LED and driving IC shown in FIG. 11F.

In the following embodiments, plural LEDs 105 (light emitters) are replaced with light emitters 100, 200, 300 or 400. Detailed descriptions are given below of the embodiments.

FIG. 1 is a side view illustrating a cross section of an LED light emitter according to Embodiment 1. As FIG. 1 shows, LED light emitter 100 of Embodiment 1 is formed by bonding, with the intermolecular force, thin-film semiconductor chip 150 to the floor (flat plane) of a pit having a tapered sidewall, the pit formed in a predetermined region of the surface of Si substrate 126. As FIG. 1 shows, thin-film semiconductor chip 150 is a thin-film semiconductor chip made of a laminate including: GaAs lower contact layer 111; AlGaAs lower cladding layer 112; AlGaAs active layer 113; AlGaAs upper cladding layer 114; and GaAs upper contact layer 115.

A predetermined voltage is applied between GaAs lower contact layer 111 and GaAs upper contact layer 115 via an unillustrated wiring layer resulting in a flow of electric current, and thus AlGaAs active layer 113 emits light. Thus produced are: light beams A1 that are emitted out in a direction that is perpendicular to thin-film semiconductor chip 150 (i.e. in the direction of the light-extraction surface); and light beams B1 that are emitted out in the direction of the sidewalls of thin-film semiconductor chip 150 (i.e., in the directions that are perpendicular to the direction of the light-extraction surface). Light beams B1 that have gone out in the direction of the sidewalls of thin-film semiconductor chip 150 are reflected by the tapered sidewall of the pit formed in Si substrate 126, and then join light beams A1. Note that light beams A1 include: light beams that are emitted out directly from the top surface of thin-film semiconductor chip 150 in the perpendicular direction to the top surface; and light beams which are emitted out from the backside surface of thin-film semiconductor chip 150 in the perpendicular direction to the backside surface (i.e., in the opposite direction to the light-extraction surface) and are then reflected off the floor of the pit formed in Si substrate 126.

FIG. 2 is a side view illustrating a cross section of an LED light emitter according to a modified example of Embodiment 1. As FIG. 2 shows, LED light emitter 200 of the modified example of Embodiment 1 is formed by bonding, with the intermolecular force, thin-film semiconductor chip 150 to the floor of a pit having a tapered sidewall, the pit formed in a predetermined region of the surface of Si substrate 126. LED light emitter 200, however, includes light-reflection layer 128 that is formed in the pit with the tapered sidewall. The description to be given below deals only with the differences between LED light emitter 200 and LED light emitter 100. To those parts of LED light emitter 200 that are common to LED light emitter 100, identical reference numerals that are used in the case of LED light emitter 100 are given, and the description thereof is omitted.

Light-reflection layer 128 is formed on the tapered sidewall and on the floor of the pit formed in Si substrate 126, and is a thin film made of a metal such as Sn, Al, Au, Ti, Pt, and AuGeNi. Light-reflection layer 128 is formed by a method, such as the metal deposition or the ion plating.

With the formation of light-reflection layer 128, light beams B2 which are emitted out in the direction of sidewalls of thin-film semiconductor chip 150 and which are then reflected by the tapered sidewall of the pit formed in Si substrate 126 satisfy B2≧B1. In addition, light beams A2 satisfy A2≧A1, light beams A2 including: light beams that are emitted out directly from the top surface of thin-film semiconductor chip 150 in the perpendicular direction to the top surface; and light beams which are emitted out from the backside surface of thin-film semiconductor chip 150 in the perpendicular direction to the backside surface and which are then reflected off the floor of the pit formed in Si substrate 126.

Descriptions are given below of the outline of a method of manufacturing the above-described LED light emitter of Embodiment 1. The descriptions given below follow the sequence of processes included in the outline of the method of manufacturing the LED light emitter. FIGS. 3A to 3D are a first series of diagrams for describing a method of manufacturing the LED light emitter according to Embodiment 1.

As FIG. 3A shows, a film of AlAs delamination layer 124 is formed onto GaAs substrate 121. Then, formed on top of AlAs delamination layer 124 is a laminate including GaAs lower contact layer 111, AlGaAs lower cladding layer 112, AlGaAs active layer 113, AlGaAs upper cladding layer 114, and GaAs upper contact layer 115, all of which are layered in this order from the bottom of FIG. 3A. The formation of these layers 124 and 111 to 115 is done by a method, such as the organic metal chemical vapor deposition method (OMCVD method).

As FIG. 3B shows, patterning is performed on the resultant laminate by the photolithography technique, followed by either a dry-etching or a wet-etching process, so as to remove, partially, GaAs lower contact layer 111, AlGaAs lower cladding layer 112, AlGaAs active layer 113, AlGaAs upper cladding layer 114, and GaAs upper contact layer 115. These layers 111 to 115 are left only in regions reserved for forming thin-film semiconductor chips 150 on top of AlAs delamination layer 124.

As FIG. 3C shows, plate 125 is attached, with an organic adhesive or the like, to the regions reserved for forming thin-film semiconductor chips 150 from above. Alternatively, plate 125 with an adherent layer may be used. Note that both the adhesive used for this purpose and plate 125 have to be made of materials that are not delaminated in the subsequent process of etching AlAs delamination layer 124.

As FIG. 3D shows, AlAs delamination layer 124 is removed with an etchant that is capable of etching only AlAs delamination layer 124, and thus obtained is thin-film semiconductor chip 150 integrated with plate 125.

FIGS. 4A to 4E are a second series of diagrams for describing the method of manufacturing the LED light emitter according to Embodiment 1. FIGS. 4A to 4E show processes of forming LED light emitter 200. The processes include: forming pits each having a tapered sidewall in a predetermined region of the surface of Si substrate 126; and bonding thin-film semiconductor chips 150 obtained in the processes shown in FIGS. 3A to 3D to the floors of the pits thus formed, respectively.

Figure 4A:
FIGS. 4A to 4E are a second series of diagrams for describing the method of manufacturing the LED light emitter according to Embodiment 1.

FIG. 4A shows Si substrate 126 that still has no pits with tapered sidewalls formed in predetermined regions of its surface.

Figure 4B:
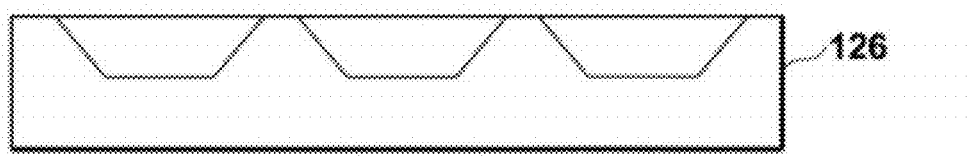

FIG. 4B shows that pits with tapered sidewalls are formed in the surface of Si substrate 126 through a patterning process by the photolithography technique and through either a dry-etching or a wet-etching process. Note that the each pit has a depth that is larger than the thickness of each thin-film semiconductor chip 150.

Figure 4C:
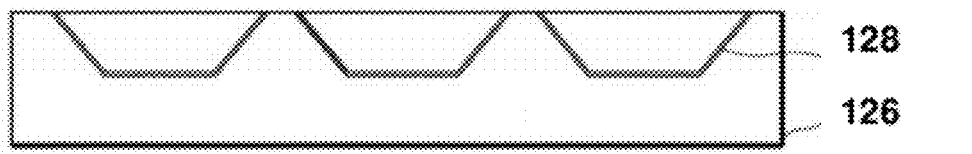

FIG. 4C shows that light-reflection layer 128 is formed on the internal surface of each pit with a tapered sidewall formed in the surface of Si substrate 126. Light-reflection layer 128 is made of a material, such as Sn, Al, Au, Ti, Pt, and AuGeNi, and is formed by a method, such as the vacuum vapor deposition method and the ion plating method.

Figure 4D:
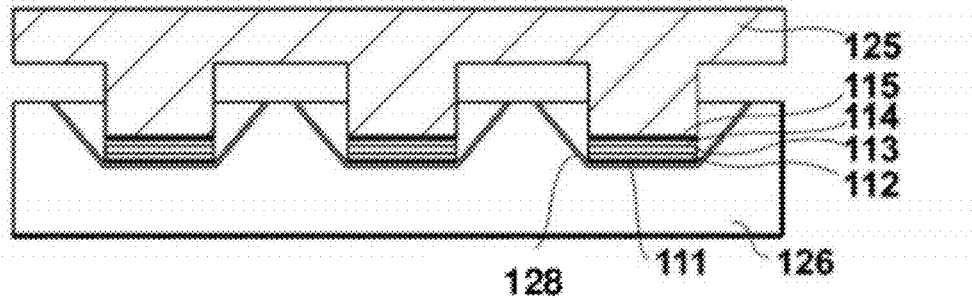

FIG. 4D shows that thin-film semiconductor chips 150 integrated with plate 125 and obtained in the process shown in FIG. 3D are directly bonded, by means of the intermolecular force or the like, respectively to the floors (flat plane) of the pits with tapered sidewalls while light-reflection layer 128 is formed on the internal surface of each pit.

Figure 4E:
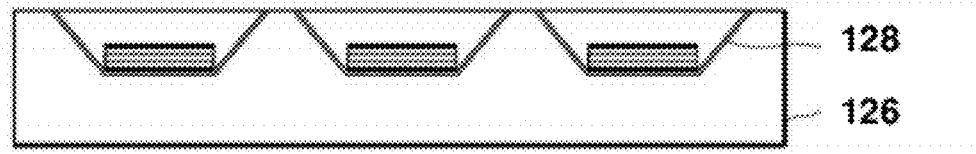

FIG. 4E shows that plate 125 is removed, with a predetermined organic solvent, from thin-film semiconductor chips 150 integrated with plate 125 so that LED light emitter 200 is produced. LED light emitter 200 is produced through the above-described processes shown in FIGS. 3A to 3D and FIGS. 4A to 4E.

As has been described thus far, according to Embodiment 1, of all the beams that are emitted out from LED light emitter 100, the extracted beams include: the light beams that are emitted out in the direction of the light-extraction surface; the light beams that are emitted out in the opposite direction to the direction of the light-extraction surface, then are reflected off the floor of the pit located at the backside of thin-film semiconductor chip 150 and then are emitted out from the light-extraction surface; and the light beams that are emitted out in the perpendicular direction to the direction of the light-extraction surface and then are re-directed, by the tapered sidewalls, in the direction of the light-extraction surface. As a consequence, a significant improvement in the light-extraction efficiency can be expected.

In addition, according to the modified example of Embodiment 1, LED light emitter 200 with light-reflection layers 128 formed on the internal surfaces of the pits with tapered sidewalls is expected to achieve a larger improvement in the light-extraction efficiency than LED light emitter 100 does.

Figure 5:
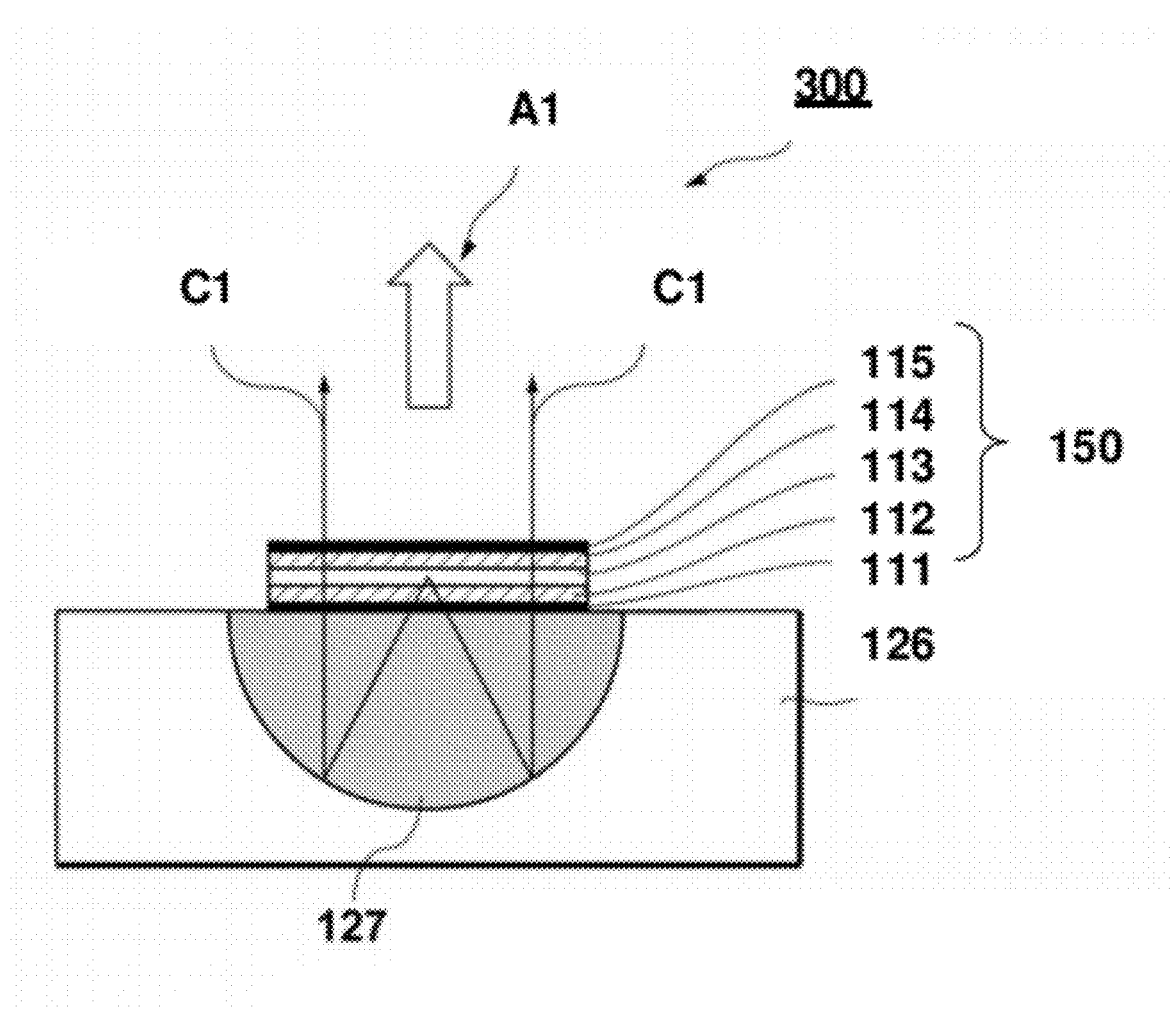
FIG. 5 is a side view illustrating a cross section of an LED light emitter according to Embodiment 2.

FIG. 5 is a side view illustrating a cross section of an LED light emitter according to Embodiment 2. As FIG. 5 shows, LED light emitter 300 of Embodiment 2 is formed by bonding thin-film semiconductor chip 150 to the top of filler 127 capable of transmitting light such as organic material filled in a pit having a spherical internal surface and formed in a predetermined region of the surface of Si substrate 126. As FIG. 5 shows, thin-film semiconductor chip 150 is a thin-film semiconductor chip made of a laminate including: GaAs lower contact layer 111; AlGaAs lower cladding layer 112; AlGaAs active layer 113; AlGaAs upper cladding layer 114; and GaAs upper contact layer 115.

A predetermined voltage is applied between GaAs lower contact layer 111 and GaAs upper contact layer 115 via an unillustrated wiring layer resulting in a flow of electric current, and thus AlGaAs active layer 113 emits light. Thus produced are: light beams A1 that are emitted out in a direction that is perpendicular to thin-film semiconductor chip 150 (i.e. in the direction of the light-extraction surface); and light beams C1 which are emitted out in the direction of the back-side surface of thin-film semiconductor chip 150 (i.e., in the directions that are opposite to the light-extraction surface) so as to spread out. Light beams C1 are reflected by the spherical internal surface of the pit formed in Si substrate 126, and then join light beams A1.

Figure 6:
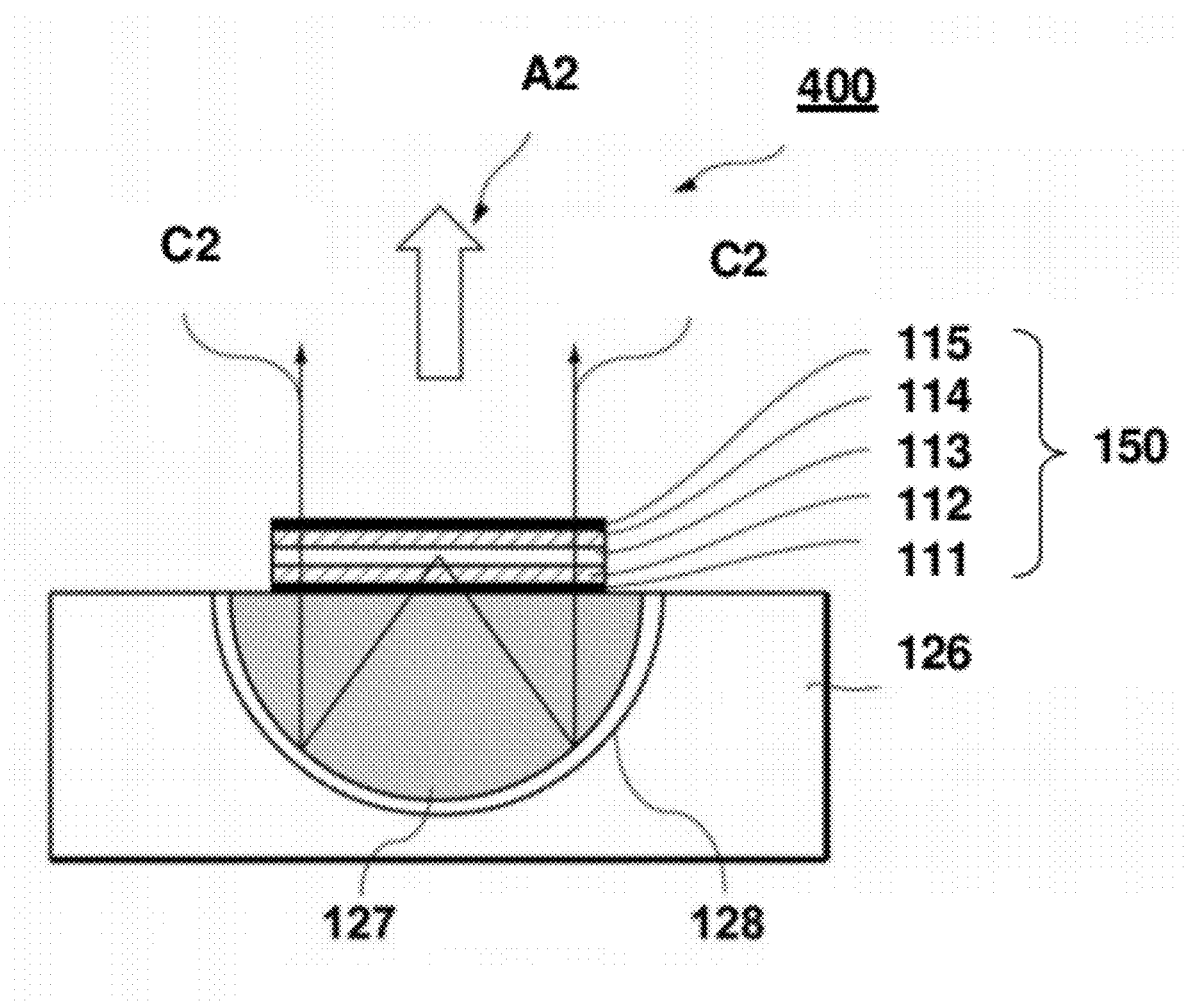
FIG. 6 is a side view illustrating a cross section of an LED light emitter according to a modified example of Embodiment 2.

FIG. 6 is a side view illustrating a cross section of an LED light emitter according to a modified example of Embodiment 2. As FIG. 6 shows, LED light emitter 400 of the modified example of Embodiment 2 is formed by bonding thin-film semiconductor chip 150 to the top of organic material 127 filled in a pit having a spherical internal surface and formed in a predetermined region of the surface of Si substrate 126. LED light emitter 400, however, includes light-reflection layer 128 that is formed in the pit with the spherical internal surface. The description to be given below deals only with the differences between LED light emitter 300 and LED light emitter 400. To those parts of LED light emitter 400 that are common to LED light emitter 300, identical reference numerals that are used in the case of LED light emitter 300 are given, and the description thereof is omitted.

Light-reflection layer 128 is formed on the spherical internal surface of the pit formed in Si substrate 126, and is a thin film made of a metal such as Sn, Al, Au, Ti, Pt, and AuGeNi. Light-reflection layer 128 is formed by a method, such as the metal deposition and the ion plating.

With the formation of light-reflection layer 128, light beams C2 which are emitted out in the direction of the back-side surface of thin-film semiconductor chip 150 and which are then reflected by the spherical internal surface of the pit formed in Si substrate 126 satisfy C2≧C1.

No description is given of a method of manufacturing the above-described LED light emitter of Embodiment 2 because the method in Embodiment 2 differs from the method in Embodiment 1 only in the following point. The pits with tapered sidewalls formed as shown in FIG. 4B are replaced with the pits with spherical internal surfaces. In addition, in the process corresponding to the one shown in FIG. 4D, organic material 127 (see FIG. 6) is filled in the pits, and then thin-film semiconductor chips 150 integrated with plate 125 are bonded to the top of organic material 127.

As has been described thus far, according to Embodiment 2, of all the beams that are excited in thin-film semiconductor chips 150, the extracted beams include: the light beams that are emitted out in the direction of the light-extraction surface; the light beams that are emitted out in the opposite direction to the direction of the light-extraction surface, then are reflected by the spherical internal surfaces of the pits and then are emitted out from the light-extraction surface; and the light beams which advances in the opposite direction to the direction of the light-extraction surface while straying from the direction of the axis perpendicular to the light-extraction direction and which then are re-directed, by being reflected by the spherical internal surface, in the direction of the light-extraction surface. As a consequence, a significant improvement in the light-extraction efficiency can be expected. In addition, organic material 127 filled in the pits with spherical internal surfaces makes the portions where thin-film semiconductor chips 150 are attached have the same level as the level of the other portions. Accordingly, an improvement in the reliability in the attaching of thin-film semiconductor chips 150 can be expected.

In addition, according to the modified example of Embodiment 2, LED light emitter 400 with light-reflection layers 128 formed on the spherical internal surfaces of the pits is expected to achieve a larger improvement in the light-extraction efficiency than LED light emitter 300 does for the following reason. With light-reflection layers 128, the beams that can be extracted efficiently include: the beams that are emitted out in the opposite direction to the direction of the light-extraction surface, then are reflected by light-reflection layers 128 located at the backside of thin-film semiconductor chip 150, and then are emitted out form the light-extraction surface; the beam which advances in the opposite direction to the direction of the light-extraction surface while straying from the direction of the axis perpendicular to the light-extraction direction.

In this example, descriptions are given of a case where the semiconductor composite device described in Embodiment 1 and Embodiment 2 is used as a LED head in an image forming apparatus.

Figure 7:
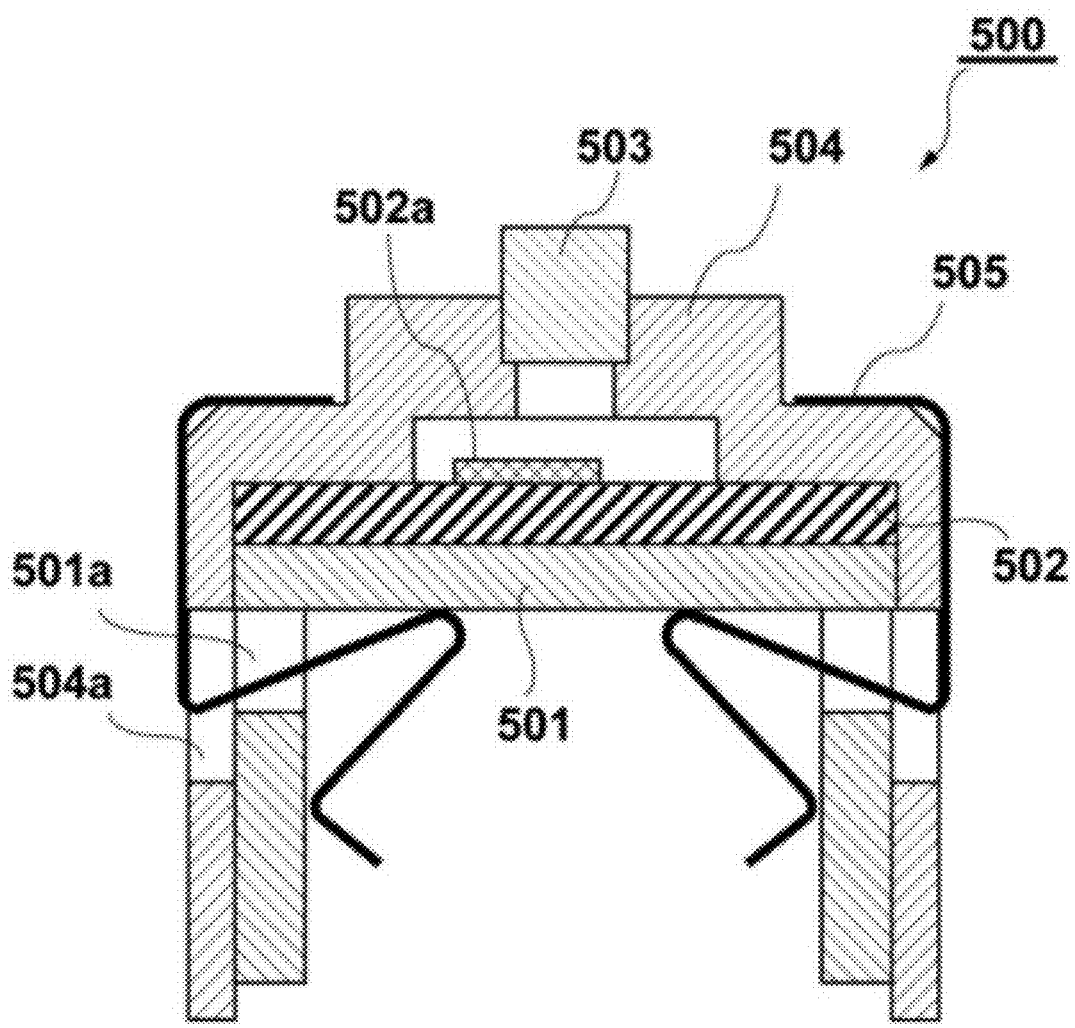
FIG. 7 is a diagram for describing a print head in which an LED head of the invention is employed.
Figure 8:
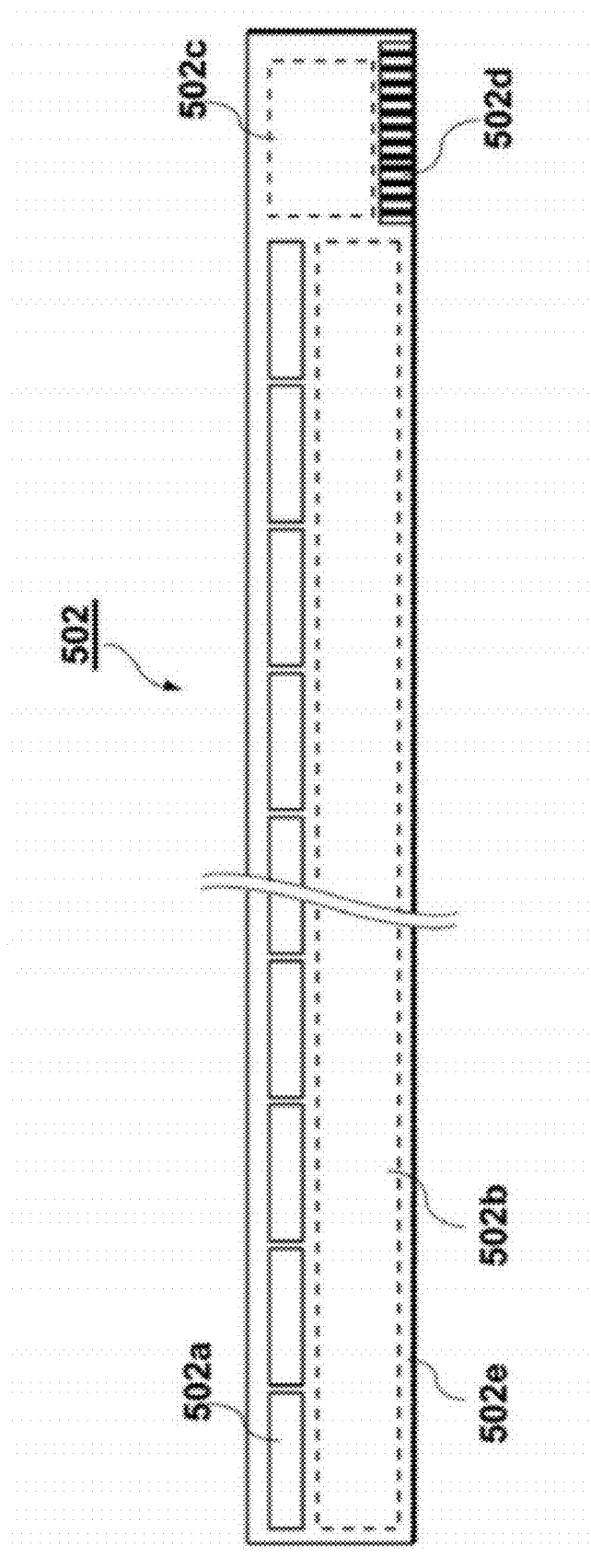
FIG. 8 is a diagram illustrating the planer arrangement of the LED head.

FIG. 7 is a diagram for describing a print head in which an LED head of the invention is employed. FIG. 8 is a diagram illustrating the planer arrangement of the LED head. As FIG. 7 shows, LED head 502 is mounted on top of base member 501. Mounted on LED head 502 are any of the semiconductor devices described in Embodiment 1 and Embodiment 2. In addition, as FIG. 8 shows, plural light-emitter units 502a, each of which is a semiconductor composite device combining a light emitter and a driving unit, are arranged on top of mounting substrate 502e along the longitudinal direction of mounting substrate 502e. In addition, wirings are formed on mounting substrate 502e, and electronic parts are to be disposed on the wirings. Moreover, electronic-parts mounting regions 502b and 502c as well as connector 502d to supply the control signals and the electric power from outside are formed in mounting substrate 502e.

Rod-lens array 503 is disposed above the light emitters of light-emitter unit 502a. Rod-lens array 503 serves as an optical element to condense the beams that are emitted out from the light emitters. In rod-lens array 503, multiple columnar optical lenses are arranged along the light emitters that are arranged in a straight line on light-emitter units 502a. Lens holder 504, which is an optical-element holder, is provided to hold rod-lens array 503 at a predetermined position.

As FIG. 7 shows, lens holder 504 is formed so as to cover base member 501 and LED head 502. Base member 501, LED head 502, and lens holder 504 are held together by damper 505 that is disposed by means of openings 501a and 504a that are formed respectively in base member 501 and in lens holder 504. Accordingly, the light beams produced by LED head 502 are emitted out towards a predetermined external member through rod-lens array 503. LED print head 500 is used as an exposure apparatus of, for example, an electrophotographic printer and an electrophotographic copy machine.

Figure 9:
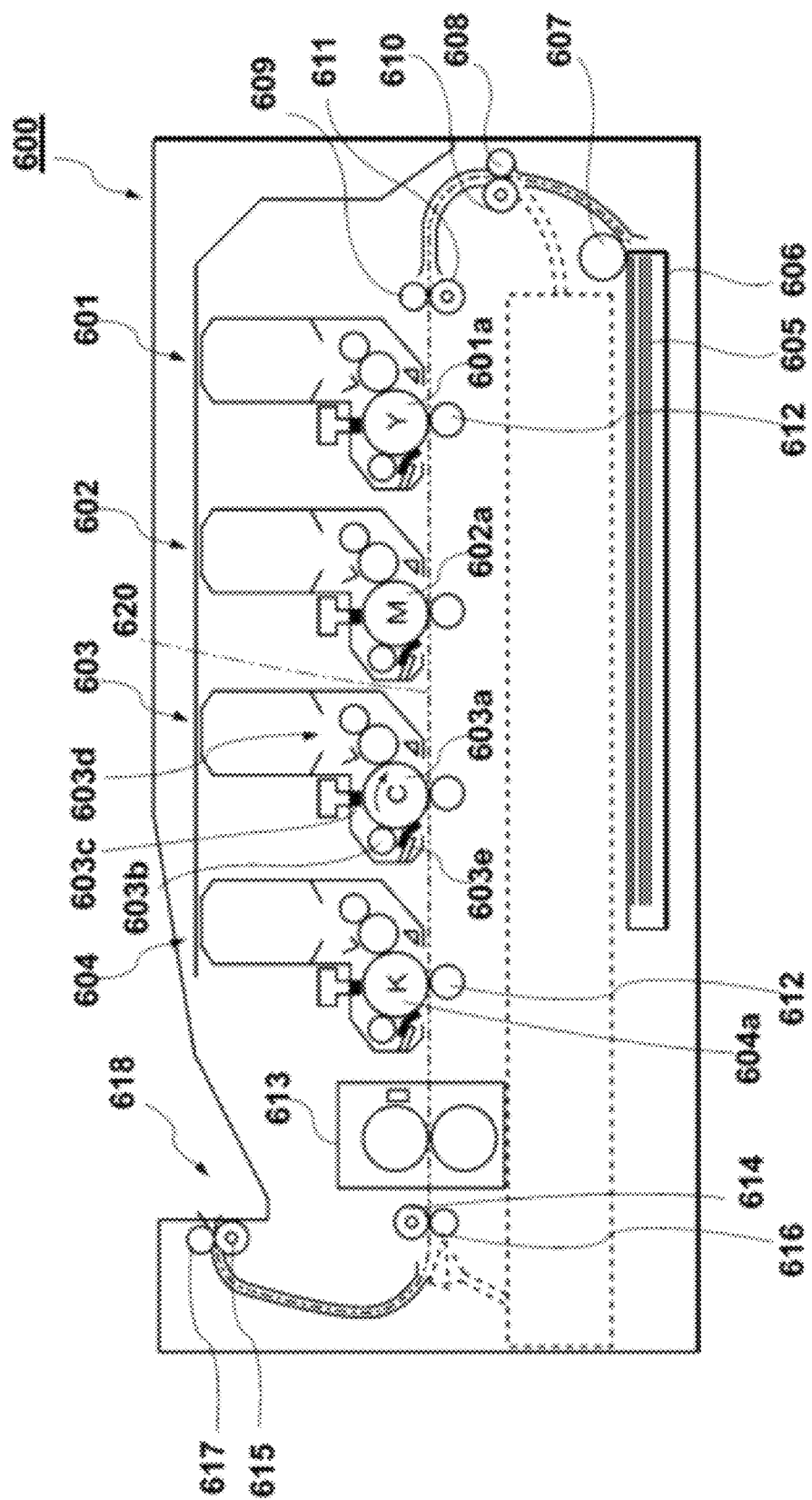
FIG. 9 is a diagram illustrating the configuration of a principal portion of an image forming apparatus of the invention.

FIG. 9 is a diagram illustrating the configuration of a principal portion of an image forming apparatus of the invention. As FIG. 9 shows, in image forming apparatus 600, four process units 601 to 604 that respectively form images of yellow, magenta, cyan, and black are disposed along conveying route 620 of printing medium 605 in this order from the upstream side of conveying route 620. The internal configurations of process units 601 to 604 are identical to one another, so that the following description of the internal configuration is based on process unit 603 of cyan.

In process unit 603, photoreceptor drum 603a serving as an image holder, is disposed so as to be rotatable in the direction indicated by the arrow. In the space surrounding photoreceptor drum 603a, the following members are disposed in an order listed below from the upstream side of the rotational direction: charging apparatus 603b to charge the surface of photoreceptor drum 603a by supplying electricity to the surface; exposure apparatus 603c to form an electrostatic latent image on the charged surface of photoreceptor drum 603a by selectively emitting light beams onto the charged surface; developing apparatus 603d to develop the image by attaching the cyan toner onto the surface of photoreceptor drum 603a with the electrostatic latent image formed thereon; and cleaning apparatus 603e to remove the toner that remains on the surface of photoreceptor drum 603a. Note that the drums or the rollers used in these apparatuses are rotated by means of unillustrated driving sources and gears.

In addition, sheet cassette 606 to store a stack of printing media 605, such as paper sheets, is set into the lower portion of image forming apparatus 600. Disposed just above sheet cassette is hopping roller 607 that withdraws printing media 605 one by one before the withdrawn one of printing media 605 is conveyed. In addition, pinch rollers 608 and 609 as well as registration rollers 610 and 611 are disposed at the downstream side of hopping roller 607 in the conveying direction of printing medium 605. Printing medium 605 is pinched by and between pinch roller 608 and registration roller 610 as well as by and between pinching roller 609 and registration roller 611. Thus registration rollers 610 and 611 correct the position of printing medium 605 if conveyed obliquely before the printing medium reaches process units 601 to 604. Hopping roller 607 and registration rollers 610 and 611 are rotated by unillustrated driving sources and gears in a coordinated way.

In each of process units 601 to 604, transfer roller 612 made of a material, such as a semi-conductive rubber, is disposed at a position opposed to the corresponding one of photoreceptor drums 601a to 604a. To attach the toner on each of photoreceptor drums 601a to 604a onto printing medium 605, a predetermined potential difference is designed to be produced between the surface of each of photoreceptor drums 601a to 604a and the surface of the corresponding one of transfer rollers 612.

Toner fixing apparatus 613 includes a heater roller and a back-up roller. The toner transferred onto printing medium 605 is fixed by being pressurized and heated by these rollers. In addition, discharging rollers 614 and 615 as well as pinch rollers 616 and 617 of the discharging unit are provided. Printing medium 605 that is discharged from toner fixing apparatus 613 is pinched by and between pinch roller 616 and discharging roller 614 and then by and between pinch roller 617 and discharging roller 615 so as to be conveyed to printing-medium stacker 618. Note that discharging rollers 614 and 615 are rotated by unillustrated driving sources and gears in a coordinated way. Exposure apparatus 603c used here is equipped with an LED unit.

Subsequently, descriptions are given of the operation of the image forming apparatus. Firstly, a sheet of printing media 605 stacked in sheet cassette 606 is withdrawn one by one from the top by means of hopping roller 607 and is conveyed. Then, the sheet of printing medium 605 is pinched by and between photoreceptor drum 601a and transfer roller 612. While the sheet thus pinched is being conveyed by the rotation of photoreceptor drum 601a, toner image is transferred to the recording surface of the sheet.

Likewise, the sheet of printing medium 605 passes sequentially through process units 602 to 604. While the sheet of printing medium 605 is passing through process units 601 to 604, toner images of the colors that are formed by developing, by means of developing apparatuses 601*d* to 604*d*, electrostatic latent images formed by exposure apparatuses 601*c* to 604*c* are sequentially transferred onto the recording surface of the sheet and laid over one another. Then, after the toner image of all the colors are laid over one another on the recording surface of the sheet, the toner images thus laid over one another are fixed by means of toner fixing apparatus 613. The resultant sheet of printing medium 605 is pinched by and between discharging roller 614 and pinch roller 616 and then by and between discharging roller 615 and pinch roller 617, and is discharged to printing-medium stacker 618 located on the outside of image forming apparatus 600. All through the processes described above, a color image is formed on printing medium 605.

As has been described thus far, an image forming apparatus equipped with an LED head in which the semiconductor device of Embodiment 1 or Embodiment 2 is employed can achieve high quality and high reliability. In addition, the improvement in the light-emitting efficiency has an effect of saving electric power.

The descriptions of the embodiments are based on cases where the invention is applied to an LED element, but this is not the only example of the invention at all. Specifically, the invention is applicable to every kind of light-emitting element formed by bonding a thin-film chip on top of a substrate.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

What is claimed is:

1. A semiconductor device comprising:
   a substrate with a pit formed in a surface thereof, wherein the pit is filled with a filler capable of transmitting light, the filler having a top surface that is coplanar with the top surface of the substrate; and
   a thin-film semiconductor element attached to a top surface of the filler filled in the pit formed in the substrate.

2. The device of claim 1, wherein the filler is an organic material.

3. The device of claim 1, wherein the thin-film semiconductor element is a light-emitting element.

4. The device of claim 3, wherein the pit includes a semispherical shape with an opening facing in the direction of light beams emitted from an active layer of the light-emitting element.

5. The device of claim 1, further comprising a film of a light-reflection layer formed in the pit.

6. The device of claim 5, wherein the light-reflection layer is substantially made of a metal thin film.

7. The device of claim 6, wherein the metal thin film contains at least one selected from the group consisting of Sn, Al, Au, Ti, Pt, and AuGeNi.

8. A light emitting diode (led) head, comprising the semiconductor device defined in claim 1.

9. An image forming apparatus, comprising the led head defined in claim 8.

10. The device of claim 1, wherein the device is configured to emit light beams from the thin-film semiconductor element to the substrate, reflect the light beams on the floor of the pit, and disperse the light beams outwardly as transmitted light beams from the thin-film semiconductor element.

* * * * *